(12) United States Patent
Li et al.

(10) Patent No.: US 9,653,460 B1
(45) Date of Patent: May 16, 2017

(54) SEMICONDUCTOR DEVICE AND METHOD OF FABRICATING THE SAME

(71) Applicant: UNITED MICROELECTRONICS CORP., Hsin-Chu (TW)

(72) Inventors: Shin-Hung Li, Nantou County (TW); Kuan-Chuan Chen, Taichung (TW); Nien-Chung Li, Hsinchu (TW); Wen-Fang Lee, Hsinchu (TW); Chih-Chung Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/057,130

(22) Filed: Mar. 1, 2016

(30) Foreign Application Priority Data

Dec. 23, 2015 (CN) ............. 2015 1 0974251

(51) Int. Cl.
| | | |
|---|---|---|
| *H01L 27/088* | (2006.01) | |
| *H01L 29/49* | (2006.01) | |
| *H01L 27/02* | (2006.01) | |
| *H01L 29/423* | (2006.01) | |
| *H01L 21/8234* | (2006.01) | |

(Continued)

(52) U.S. Cl.
CPC ...... *H01L 27/088* (2013.01); *H01L 21/28035* (2013.01); *H01L 21/28088* (2013.01); *H01L 21/31051* (2013.01); *H01L 21/82345* (2013.01); *H01L 21/823456* (2013.01); *H01L 27/0207* (2013.01); *H01L 29/42364* (2013.01); *H01L 29/42372* (2013.01); *H01L 29/45* (2013.01); *H01L 29/4933* (2013.01); *H01L 29/4966* (2013.01); *H01L 29/6656* (2013.01); *H01L 29/66545* (2013.01)

(58) Field of Classification Search
CPC ............ H01L 27/088; H01L 27/0207; H01L 29/42364; H01L 29/42372; H01L 29/45; H01L 29/4933; H01L 29/4966; H01L 29/66545; H01L 29/6656; H01L 21/28035; H01L 21/28088; H01L 21/31051; H01L 21/82345; H01L 21/823456
USPC ....................................... 257/392
See application file for complete search history.

(56) References Cited

U.S. PATENT DOCUMENTS

| | | | |
|---|---|---|---|
| 8,350,337 B2 | 1/2013 | Tseng et al. | |
| 2010/0052058 A1 | 3/2010 | Hsu et al. | |
| 2015/0041875 A1* | 2/2015 | Perera | ............ H01L 29/78 257/314 |

OTHER PUBLICATIONS

Wang, Title of Invention: Semiconductor Device and Method for Fabricating the Same, U.S. Appl. No. 14/925,955, filed Oct. 28, 2015.

* cited by examiner

*Primary Examiner* — Tu-Tu Ho
(74) *Attorney, Agent, or Firm* — Winston Hsu; Scott Margo

(57) ABSTRACT

A semiconductor device and a method of fabricating the same, the semiconductor device includes a substrate, a first gate and a second gate. The first gate is disposed on the substrate and includes a first gate insulating layer, a polysilicon layer, a silicide layer and a protective layer stacked with each other on the substrate and a first spacer surrounds the first gate insulating layer, the polysilicon layer, the silicide layer and the protective layer. The second gate is disposed on the substrate and includes a second gate insulating layer, a work function metal layer and a conductive layer stacked with each other on the substrate, and a second (Continued)

spacer surrounds the second gate insulating layer, the work function metal layer and the conductive layer.

10 Claims, 5 Drawing Sheets

(51) Int. Cl.
*H01L 21/28* (2006.01)
*H01L 29/45* (2006.01)
*H01L 21/3105* (2006.01)
*H01L 29/66* (2006.01)

SEMICONDUCTOR DEVICE AND METHOD OF FABRICATING THE SAME

BACKGROUND OF THE INVENTION

1. Field of the Invention

The present invention relates to a semiconductor device and a method of fabricating the same, more particularly, to a high voltage metal-oxide semiconductor (HVMOS) transistor and a method of fabricating the same.

2. Description of the Prior Art

High-voltage components are generally used in power circuits of flat panels or flash memory, having particular structures for sustaining high voltages, wherein the HVMOS transistors may function as switches and are broadly utilized in central processing unit (CPU) power supplies, power management systems, AC/DC converters, liquid crystal display (LCD) and plasma TV drivers, automobile electronic components, personal computer (PC) peripheral devices, small DC motor controllers, and other consumer electronic devices.

Generally, in an integrated fabricating process of a high-voltage semiconductor element and a low-voltage semiconductor element, the low-voltage semiconductor element is formed based on a replacement metal gate process. However, with the progress of semiconductor and the trend towards scaling down the size of the semiconductor devices nowadays, the process complexity is increased accordingly. Also, the quality and reliability of electronic devices are seriously affected. Therefore, there is an urgent need to integrate the process of conventional HVMOS and advanced metal gate technology, in order to meet the practical requirement.

SUMMARY OF THE INVENTION

It is one of the objectives of the present invention to provide a semiconductor device and a method of fabricating the same, in which, the gate height thereof may be more efficiently controlled, so as to provide better component performances.

To achieve the purpose described above, a preferred embodiment of the present invention provides a semiconductor device including a substrate, a first gate and a second gate. The first gate is disposed on the substrate and includes a first gate insulating layer, a polysilicon layer, a silicide layer and a protective layer stacked with each other on the substrate and a first spacer surrounds the first gate insulating layer, the polysilicon layer, the silicide layer and the protective layer. The second gate is disposed on the substrate and includes a second gate insulating layer, a work function metal layer and a conductive layer stacked with each other on the substrate, and a second spacer surrounds the second gate insulating layer, the work function metal layer and the conductive layer.

To achieve the purpose described above, another preferred embodiment of the present invention provides a method of forming a semiconductor device, including following steps. First of all, a first gate is formed on the substrate, wherein the first gate includes a first gate insulating layer and a polysilicon layer stacked with each other on the substrate, and a first spacer surrounded the first gate insulating layer and the polysilicon layer. Then, the polysilicon layer is partially removed, to form a trench. Next, a silicide layer is formed on the polysilicon layer, in the trench. Finally, a protective layer is formed on the silicide layer to fill up the trench.

According to above, the method of the present invention enables to form gate structures in different dimension in different transistor regions, and effectively control the gate height thereof, thereby avoiding the gate structure occurring dishing issues in the subsequent processes, and further avoiding the damages to the entire performances. In this way, the gate structures disposed in the two transistor regions of the present invention may obtain different threshold voltages ($V_{th}$), thereby forming N-type or P-type transistors with a high threshold voltage (HVT), a low threshold voltage (LVT) or a standard threshold voltage (SVT) in the semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are diagrams illustrating a method of fabricating a semiconductor device according to a preferred embodiment of the present invention, in which:

FIG. 1 is a schematic diagram showing a semiconductor device at the beginning of the fabricating process;

FIG. 2 is a schematic diagram showing a semiconductor device after forming a patterned photoresist layer;

FIG. 3 is a schematic diagram showing a semiconductor device after performing an etching process to reduce a gate height;

FIG. 4 is a schematic diagram showing a semiconductor device after performing a silicidation process;

FIG. 5 is a schematic diagram showing a semiconductor device after forming a contact etching stop layer;

FIG. 6 is a schematic diagram showing a semiconductor device after forming an interlayer dielectric layer;

FIG. 7 is a schematic diagram showing a semiconductor device after performing a planarization process;

FIG. 8 is a schematic diagram showing a semiconductor device after performing another etching process to remove a dummy gate electrode; and FIG. 9 is a schematic diagram showing a semiconductor device after forming a metal gate structure.

DETAILED DESCRIPTION

To provide a better understanding of the present invention to users skilled in the technology of the present invention, preferred embodiments are detailed as follows. The preferred embodiments of the present invention are illustrated in the accompanying figures to clarify the contents and effects to be achieved.

Figure 1:
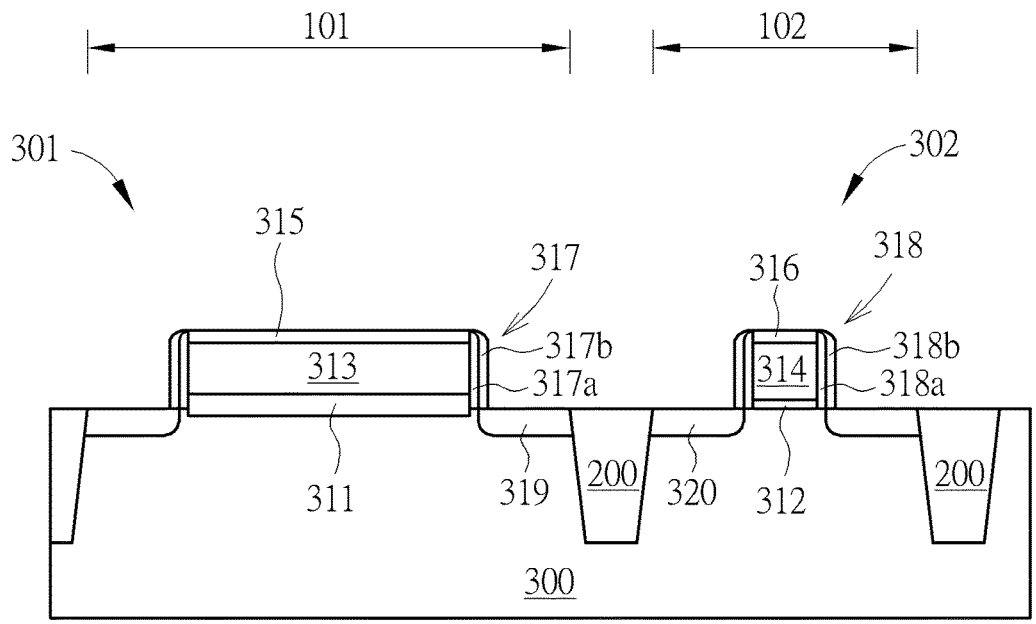

Please refers to FIG. 1 to FIG. 9, which are diagrams illustrating a method of fabricating a semiconductor device according to a preferred embodiment of the present invention. Firstly, as shown in FIG. 1, a substrate 300 is provided, in which the substrate 300 may include a semiconductor substrate such as a silicon substrate, a silicon-containing substrate or a silicon-on-insulator (SOI) substrate, but is not limited thereto. In one embodiment of the present invention, at least one shallow trench isolation (STI) 200 may be formed in the substrate 300 to define two transistor regions 101, 102 on the substrate 300, in which the two transistor regions are preferably in the same conductive type, for example, being PMOS transistor regions or NMOS transistor regions. Then, the two transistor regions 101, 102 are configured to fabricate gate structures having different threshold voltages ($V_{th}$). However, in another embodiment of the present invention, the two transistor regions 101, 102 may also indifferent conductive types, for example, with the transistor region 101 being a PMOS transistor region and the transistor region 102 being an NMOS transistor region.

Next, gate structures 301, 302 are formed on the substrate 300, within the two transistor regions 101, 102. The gate structure 301 includes a first gate insulating layer 311, a gate electrode 313, a capping layer 315 and a spacer 317 and source/drain regions 319 are formed at two sides of the gate structures 301. The first gate insulating layer 311 for example includes silicon dioxide ($SiO_2$), silicon nitride (SiN) or silicon oxynitride (SiON); the gate electrode 313 for example includes doped polysilicon material, undoped polysilicon material, amorphous silicon material or a combination thereof; the capping layer 315 for example includes silicon dioxide, silicon nitride, silicon carbide (SiC), silicon carbonitride (SiCN) or a combination thereof. The spacer 317 may have a multilayer structure, for example being consisted of a first spacer 317a and a second spacer 317b shown in FIG. 1, in which the first spacer 317a and the second spacer 317b may include high temperature oxide (HTO), SiN, silicon oxide (SiO), SiON, or silicon nitride formed by hexachlorodisilane ($Si_2Cl_6$) (HCD-SiN). However, in another embodiment, the spacer (not shown in the drawings) in a monolayer structure may also be formed optionally.

On the other hand, the gate structure 302 includes a second gate insulating layer 312, a dummy gate electrode 314, a capping layer 316 and a spacer 318 and source/drain regions 320 are formed at two sides of the gate structures 302, in which the dummy gate electrode 314 and the capping layer 316 may have similar materials to those of the gate electrode 313 and the capping layer 315, but is not limited thereto. Also the spacer 318 may also have a multilayer structure, for example including a first spacer 318a and a second spacer 318b shown in FIG. 1, in which the materials of the first spacer 318a and the second spacer 318b may also be the same as those of the first spacer 317a and the second spacer 317b, but is not limited thereto.

In one embodiment of the present invention, the formation of the gate structures 301, 302 may include forming a first gate insulating material layer (not shown in the drawings) and a second gate insulating material layer (not shown in the drawings) in the transistor regions 101, 102 respectively, forming a gate material layer (not shown in the drawings) and a capping material layer (not shown in the drawings) stacked with each other on the substrate 300, and patterning those stacked layers to form a gate stack structure respectively in the transistor regions 101 102. It is worth noting that, the first gate insulating layer 311 may be formed in the first transistor region 101 through a thermal oxidation process, and the first gate insulating layer 311 may have a thickness being about 95 to 140 angstroms, but is not limited thereto. Accordingly, a portion of the first gate insulating layer 311, preferably the bottom portion thereof (about half of the overall thickness), is formed in the substrate 300, as shown in FIG. 1. On the other hand, the second gate insulating layer may be formed through a deposition process, and the second gate insulating layer 312 preferably has an interfacial layer (not shown in the drawings) including a silicon oxide ($SiO_2$), a SiON layer or a combination thereof and a high-k dielectric layer (not shown in the drawings) formed on the interfacial layer. The second gate insulating layer 312 has a relative less thickness than that of the first gate insulating layer 311, as shown in FIG. 1. The high-k dielectric layer for example includes a dielectric material having dielectric constants (k value) larger than 4, such as hafnium oxide ($HfO_2$), hafnium silicon oxide ($HfSiO_4$) or aluminum oxide ($Al_2O_3$), but is not limited.

Following these, the first spacers 317a, 318a are formed to surround the gate stacked structures in the two transistor regions 101, 102, and the source/drain regions 319, 320 are formed at two sides of the gate stacked structures in the substrate 300. Finally, the second spacers 317b, 318b are formed on sidewalls of the first spacers 317a, 318a respectively, thereby forming the gate structures 301, 302.

Figure 2:
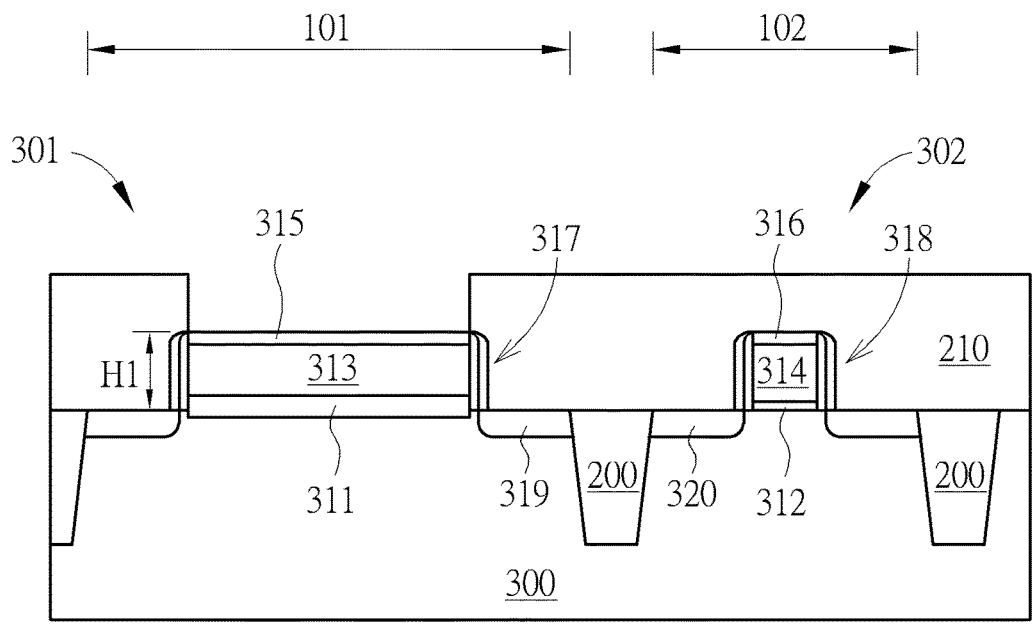

In the present embodiment, the gate structures 301, 302 may have the same height H1 according to 500 to 550 angstroms, and the channel regions (not shown in the drawings) thereof are preferably in different dimensions, as shown in FIG. 2. For example, the gate structure 301 may include a channel region being about 300 to 350 nanometers, and the gate structure 302 may include a channel region being about 28 nanometers, but is not limited thereto. Please note that, the gate structures of the present invention is not limited to be formed through aforementioned steps, and may further include other forming processes. In another embodiment a stress memorization technique (SMT) may be optionally performed after the gate structures 301, 302 are formed, for example including forming a stress memorization layer (not shown in the drawings) on the substrate 300 and performing a thermal process, or forming an epitaxial layer (not shown in the drawings) in the substrate 300, for providing requested stresses.

Figure 3:
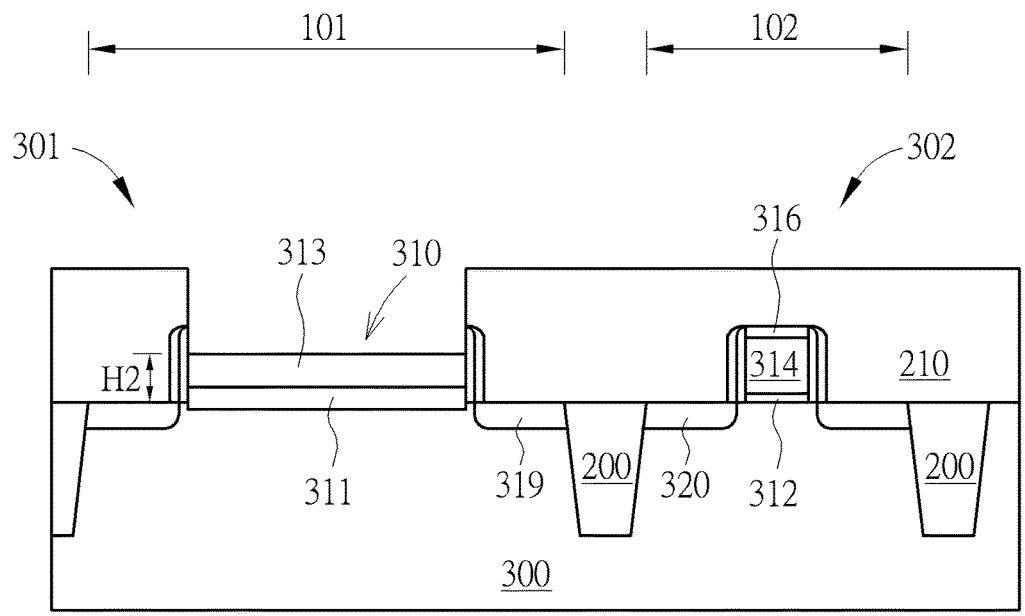

After the gate structures 301, 302 are formed, a patterned photoresist layer 210 may be formed to cover a portion of the substrate 300 and the gate structure 302, so that, the gate structure 301 may be only exposed therefrom, as shown in FIG. 2. Then, an etching process is performed through the patterned photoresist layer 210 to remove the capping layer 315, and a wet etching process or a sequent performed dry etching process and wet etching process is performed through the patterned photoresist layer 210 to remove a portion of the gate electrode 313 and to form a trench 310. The wet etching process is performed by using an etchant, such as ammonium hydroxide ($NH_4OH$) or tetramethylammonium hydroxide (TMAH). In other words, through performing the etching process, the gate electrode 313 is firstly exposed and further etched till reducing the height H2 (thereof to less than the height of the dummy gate electrode 312, for example being about 380 to 400 angstroms, as shown in FIG. 3.

Figure 4:
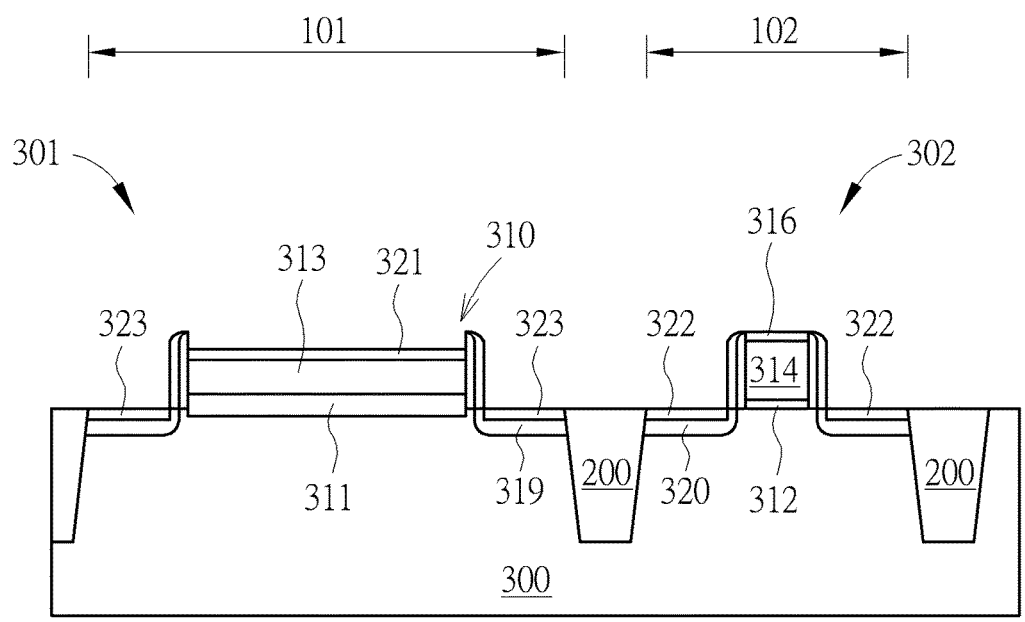

Then, after completely removing the patterned photoresist layer 210, a silicidation process is carried out to form silicide layers 321, 322, 323 on top surfaces of the gate electrode 313 and the source/drain regions 319, 320 respectively, as shown in FIG. 4. The silicidation process for example includes entirely forming a metal layer (not shown in the drawings), such as cobalt (Co), titanium (Ti), nickel (Ni) or molybdenum (Mo), and performing a rapid thermal process (RTP), so that, the metal layer may react with the silicon within the source/drain regions 319, 320 and the gate electrode 313, thereby forming the silicide layers 321, 322, 323. Also, the silicide layer 321 is lower than a top surface of the spacer 317, as shown in FIG. 4.

Figure 5:
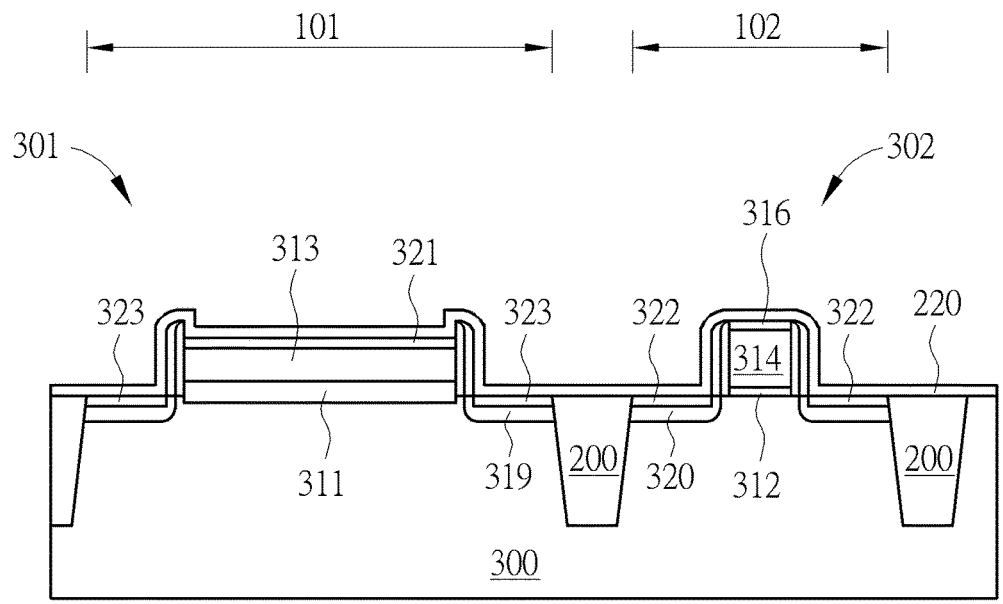
Figure 6:
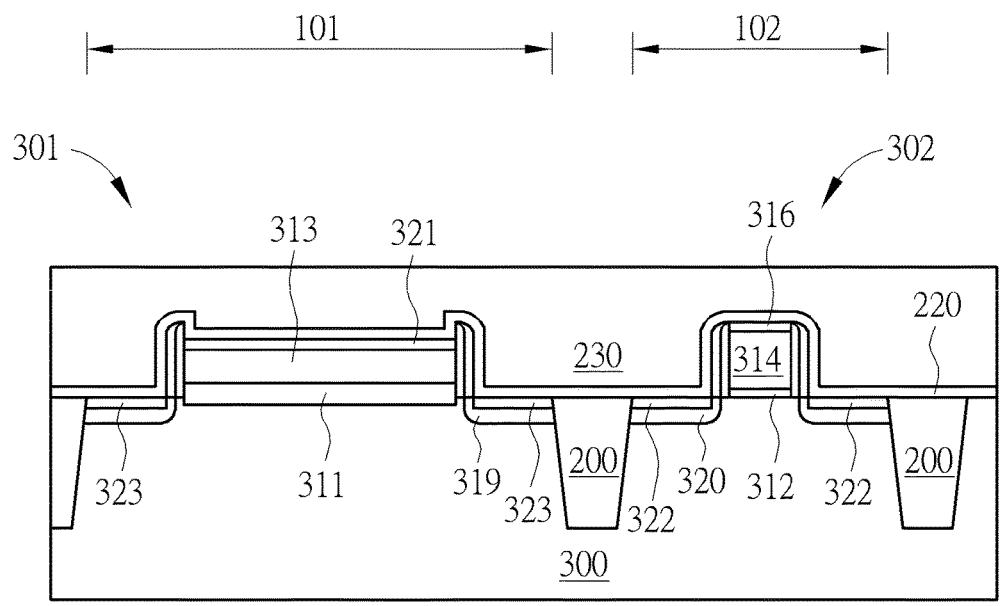

Then, a contact etching stop layer (CESL) 220 and an interlayer dielectric (ILD) layer 230 are sequentially formed on the substrate 300, as shown in FIG. 5 and FIG. 6. The contact etching stop layer 220 covers the dummy gate electrode 314, the silicide layers 322, 323 and a portion of the contact etching stop layer 220 is filled in the trench 310 and covers on the silicide layer 321, as shown in FIG. 5.

Then, the ILD layer 230 is formed on the contact etching stop layer 220 as shown in FIG. 6.

Figure 7:
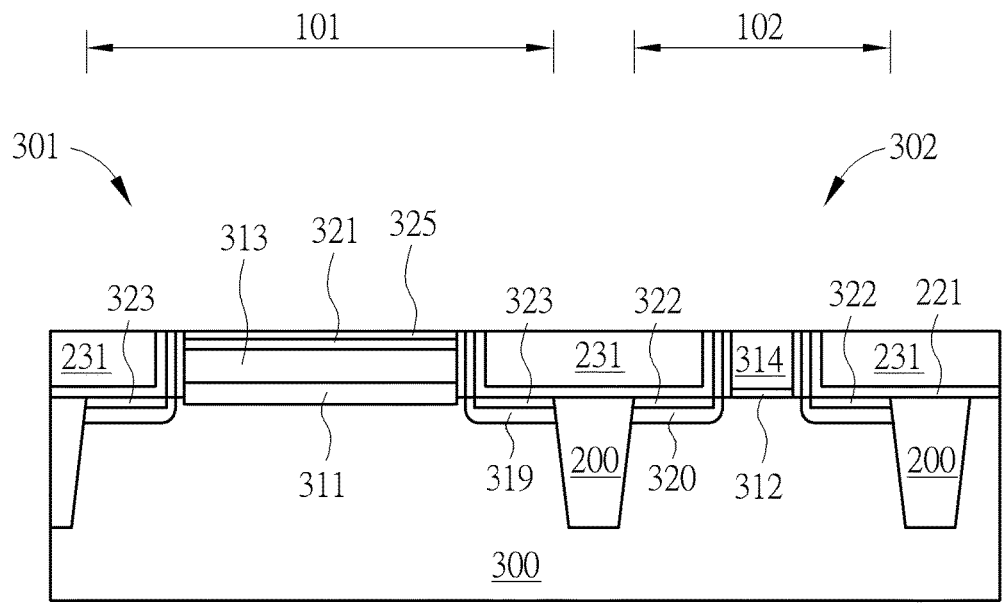

Next, a planarization process such as a chemical mechanical polishing (CMP) and/or an etching back process is performed to remove a portion of the contact etching stop layer 220 and the ILD layer 230, thereby forming a contact etching stop layer 221 and an interlayer dielectric (ILD) layer 231 and exposing top surfaces of the gate structures 301, 302 respectively. The contact etching stop layer 220 filled in the trench 310 may form a protective layer 325 covered on the silicide layer 321 while the planarization process is performed, as shown in FIG. 7. Through this performance, the top surface of the ILD layer 231 is leveled with the top surfaces of the protective layer 325 of the gate structure 301 and the dummy gate electrode 314 of the gate structure 302, as shown in FIG. 7.

Figure 8:
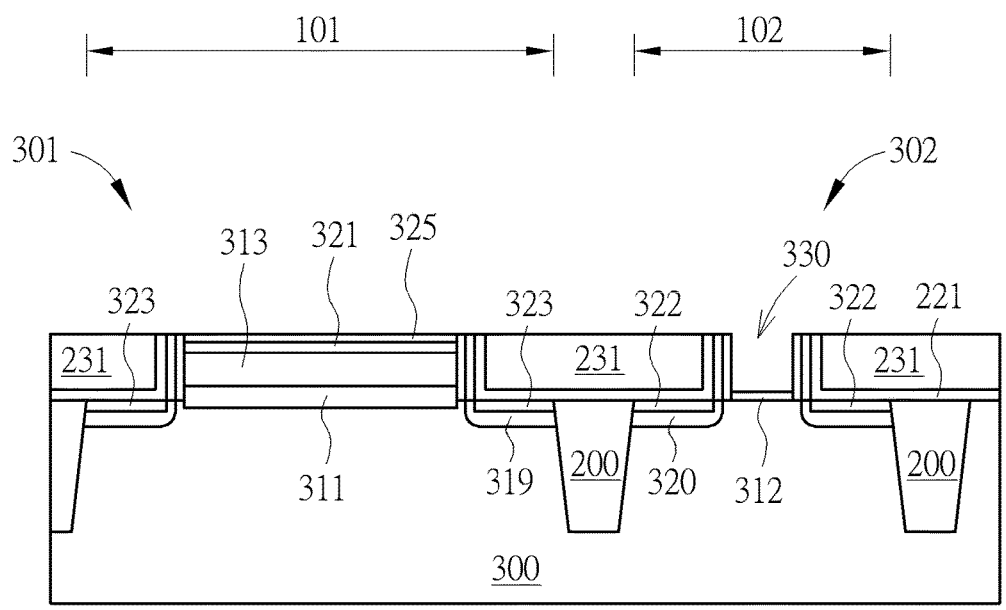

Subsequently, another etching process such as a dry etching process, a wet etching process or a sequent performed dry and wet etching processes may be carried out by using an etchant, such as ammonium hydroxide or tetramethylammonium hydroxide, to remove the dummy gate electrode 314 and to form a gate trench 330 in the ILD layer 231, as shown in FIG. 8.

Figure 9:
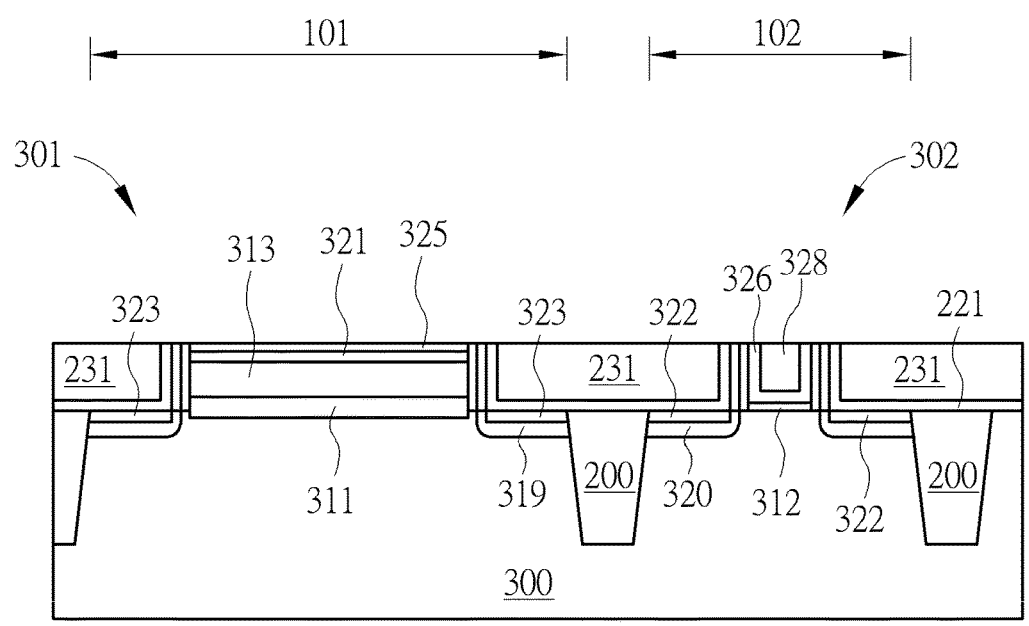

Finally, a work function metal layer, and a conductive layer are sequentially formed in the gate trench 330 on the second gate insulating layer 312, in the transistor region 102, and another planarization process such as a chemical mechanical polishing is performed to remove the work function metal layer and the conductive layer disposed on the top surfaces of the ILD layer 231, thereby forming a U-shaped work function metal layer 326, and a conductive layer 328 filled in the gate trench 330, as shown in FIG. 9.

In one embodiment, the materials of the work function metal layer 326 may differ from the transistor type adapted in an NMOS or a PMOS transistor. For example, if the transistor is an NMOS transistor, the work function metal layer 326 may include a metal material having a work function ranging between 3.9 eV and 4.3 eV, such as titanium aluminide (TiAl), zirconium aluminide (ZrAl) or tungsten aluminide (WAl), but is not limited thereto. In contrast, if the transistor is a PMOS transistor, the work function metal layer 326 may include a metal material having a work function ranging between 4.8 eV and 5.2 eV, such as titanium nitride, tantalum nitride or tantalum carbide (TaC). The conductive layer 328 may include a low resistivity material, such as aluminum (Al), tungsten (W), titanium aluminide (TiAl) or cobalt tungsten phosphide (CoWP), but is not limited thereto.

Through the aforementioned fabricating processes, the semiconductor device according to the preferred embodiment of the present invention is obtained. In the present embodiment, the two gate structures formed in the two transistor regions preferably include the same conductive type, being P-type gate structures or N-type gate structures for example. The two gate structures are than etched by using a patterned photoresist layer as a mask to tune the gate height of one gate structure thereof, and then, a replacement metal gate (RMG) process is performed to replace the other gate structure with a metal gate structure. In other words, in one transistor region thereof, the gate structure includes a first gate insulating layer, a polysilicon layer, a first silicide layer and a protective layer stacked with each other on the substrate; and in another transistor region thereof, the gate structure includes a second gate insulating layer, a work function metal layer and a conductive layer stacked with each other on the substrate, in which the polysilicon layer is lower than the top surface of the conductive layer and the first gate insulating layer has a thickness being greater than that of the second gate insulating layer.

In summary, the method of the present invention enables to form gate structures in different dimension in different transistor regions, and effectively control the gate height thereof, thereby avoiding the gate height being affected in the subsequent processes to damage the entire performances. In this way, the gate structures disposed in the two transistor regions of the present invention may obtain different threshold voltages, thereby forming N-type or P-type transistors with a high threshold voltage (HVT) and a low threshold voltage (LVT), or N-type or P-type transistors with a high threshold voltage and a standard threshold voltage (SVT) in the semiconductor device.

Additionally, people who are skilled in the art shall realize the method of forming the semiconductor device in the present invention is not limited to the aforementioned steps, and may also include other processes. For example, although the gate structure 302 is formed through a "high-k first" process, the forming method of the present invention is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate; and
   a first gate disposed on the substrate, the first gate comprising:
      a first gate insulating layer, a polysilicon layer, a silicide layer and a protective layer stacked with each other on the substrate; and
      a first spacer surrounded the first gate insulating layer, the polysilicon layer, the silicide layer and the protective layer and contacting two opposite sidewalls of the first gate insulating layer, the polysilicon layer, the silicide layer and the protective layer; and
   a second gate disposed on the substrate, the second gate comprising:
      a second gate insulating layer, a work function metal layer and a conductive layer stacked with each other on the substrate; and
      a second spacer surrounded the second gate insulating layer, the work function metal layer and the conductive layer.

2. The semiconductor device according to claim 1, wherein the silicide layer is disposed lower than top surfaces of the first spacer.

3. The semiconductor device according to claim 1, further comprising:
   first source/drain regions disposed at two sides of the first gate in the substrate and another silicide layer disposed on the first source/drain regions.

4. The semiconductor device according to claim 3, further comprising:
   a contact etching stop layer disposed on the substrate, covering the first spacer and the another silicide layer.

5. The semiconductor device according to claim 1, wherein the first gate insulating layer has a thickness being greater than a thickness of the second gate insulating layer.

6. The semiconductor device according to claim 1, wherein a dimension of the first gate is greater than a dimension of the second gate.

7. The semiconductor device according to claim 1, wherein the second gate insulating layer comprises an interfacial layer and a high-k dielectric layer disposed on the interfacial layer.

8. The semiconductor device according to claim 7, wherein the interfacial layer comprises silicon oxide, silicon oxynitride or a combination thereof.

9. The semiconductor device according to claim 4, further comprising:
   an interlayer dielectric (ILD) layer disposed on the contact etching stop layer, wherein top surfaces of the ILD layer is level with top surfaces of the first gate and the second gate.

10. The semiconductor device according to claim 1, wherein a portion of the first gate insulating layer is disposed in the substrate.

\* \* \* \* \*